United States Patent
Lin et al.

(10) Patent No.: US 10,312,614 B2
(45) Date of Patent: Jun. 4, 2019

(54) ADAPTIVE CARD AND MOTHERBOARD HAVING THE SAME

(71) Applicant: ASUSTeK COMPUTER INC., Taipei (TW)

(72) Inventors: Bing-Min Lin, Taipei (TW); Chen-Wei Fan, Taipei (TW); Tzu-Yang Tseng, Taipei (TW); I-Ying Chih, Taipei (TW); Hung-Kuo Kuo, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 15/813,265

(22) Filed: Nov. 15, 2017

(65) Prior Publication Data

US 2018/0138612 A1    May 17, 2018

(30) Foreign Application Priority Data

Nov. 17, 2016  (CN) .................... 2016 2 1252669 U

(51) Int. Cl.
    *G06F 1/18*    (2006.01)
    *G06F 1/20*    (2006.01)
    (Continued)

(52) U.S. Cl.
    CPC ........... *H01R 12/716* (2013.01); *G06F 1/185* (2013.01); *G06F 1/186* (2013.01); *G06F 1/187* (2013.01);
    (Continued)

(58) Field of Classification Search
    CPC .............. H01R 23/725; H01R 23/7068; H01R 23/722; H01R 13/7175; H01R 13/717;
    (Continued)

(56) References Cited

U.S. PATENT DOCUMENTS

| 3,629,787 A | 12/1971 | Wilson |
| 4,683,550 A * | 7/1987 | Jindrick ............... G06F 13/409 |
| | | 361/679.21 |

(Continued)

FOREIGN PATENT DOCUMENTS

| WO | 2011/090478 A1 | 7/2011 |
| WO | 2016/122461 A1 | 8/2016 |
| WO | 2016/122594 A1 | 8/2016 |

OTHER PUBLICATIONS

Wes Fenlon:"RGB LEDs are all over motherboards at Computex 2016 /PC Gamer", Jun. 1, 2016 (Jun. 1, 2016), XP055459329, Retrieved from the internet:URL: https://www.pcgamer.com/rgb-leds-are-all-over-motherboards-at-computex-2016/.

*Primary Examiner* — Gary F Paumen
(74) *Attorney, Agent, or Firm* — McClure, Qualey & Rodack, LLP

(57) ABSTRACT

An adaptive card is provided. The adaptive card is adapted to a motherboard with a connecting slot. The adaptive card includes a main body, a first connector, a second connector, a plurality of first fixing holes, a plurality of second fixing holes and a port. The main body includes a first surface, a second surface and a side edge. The first connector is configured on the first surface. The second connector is configured on the second surface. A plurality of first fixing holes are formed on the first surface and arranged along a direction corresponding to an insertion direction of the first connector. A plurality of second fixing holes are formed on the second surface and arranged along a direction corresponding to an insertion direction of the second connector. A port is configured on the side edge and used to be connected to the connecting slot.

8 Claims, 6 Drawing Sheets

(51) Int. Cl.
*H05K 1/02* (2006.01)
*H05K 1/14* (2006.01)
*H05K 1/18* (2006.01)
*H01R 12/71* (2011.01)
*H01R 12/72* (2011.01)
*H01R 13/64* (2006.01)
*H01R 13/717* (2006.01)

(52) U.S. Cl.
CPC ............ *G06F 1/20* (2013.01); *H01R 12/721* (2013.01); *H01R 13/64* (2013.01); *H01R 13/7172* (2013.01); *H01R 13/7175* (2013.01); *H05K 1/0201* (2013.01); *H05K 1/142* (2013.01); *H05K 1/18* (2013.01); *H01R 2201/06* (2013.01); *H05K 2201/10106* (2013.01)

(58) Field of Classification Search
CPC .... H01R 13/64; H01R 13/7172; H01R 9/096; H01R 12/716; H01R 12/721; H01R 2201/06; H05K 7/142; H05K 7/1418; H05K 7/1417; H05K 1/142; H05K 1/0201; H05K 1/18; H05K 2201/10106; G06F 1/184; G06F 1/186; G06F 1/185; G06F 1/187; G06F 1/20
USPC ...... 439/74, 62, 65, 490; 361/752, 756–759, 361/801–802
See application file for complete search history.

(56) References Cited

U.S. PATENT DOCUMENTS

| | | | | |
|---|---|---|---|---|
| 5,268,820 | A | * | 12/1993 | Tseng .................... H05K 1/141 361/760 |
| 5,575,686 | A | * | 11/1996 | Noschese ............... H01R 23/68 327/262 |
| 6,324,071 | B2 | * | 11/2001 | Weber .................... H05K 1/144 228/180.21 |
| 6,418,034 | B1 | * | 7/2002 | Weber .................... H05K 1/144 228/180.21 |
| 6,585,534 | B2 | * | 7/2003 | Llapitan ............... H01L 23/4093 257/E23.086 |
| 6,990,847 | B2 | | 1/2006 | Happach |
| 7,359,012 | B2 | | 4/2008 | Ishiwa et al. |
| 7,439,750 | B2 | | 10/2008 | Lindorfer |
| 8,064,199 | B2 | | 11/2011 | Lin |
| 8,339,263 | B2 | | 12/2012 | Paananen et al. |
| 9,136,651 | B2 | * | 9/2015 | Xuan ................. H01R 13/7175 |
| 9,265,175 | B2 | | 2/2016 | Yoshida et al. |
| 9,913,401 | B2 | | 3/2018 | Gonzalez Inda et al. |
| 2003/0077925 | A1 | * | 4/2003 | Cermak, III ............. G06F 1/184 439/74 |
| 2007/0015381 | A1 | * | 1/2007 | Muff ........................ G11C 5/04 439/74 |
| 2007/0197056 | A1 | * | 8/2007 | Huang .................... G06F 1/185 439/74 |
| 2009/0154092 | A1 | | 6/2009 | Chen |
| 2014/0118937 | A1 | | 5/2014 | Adrian et al. |

* cited by examiner

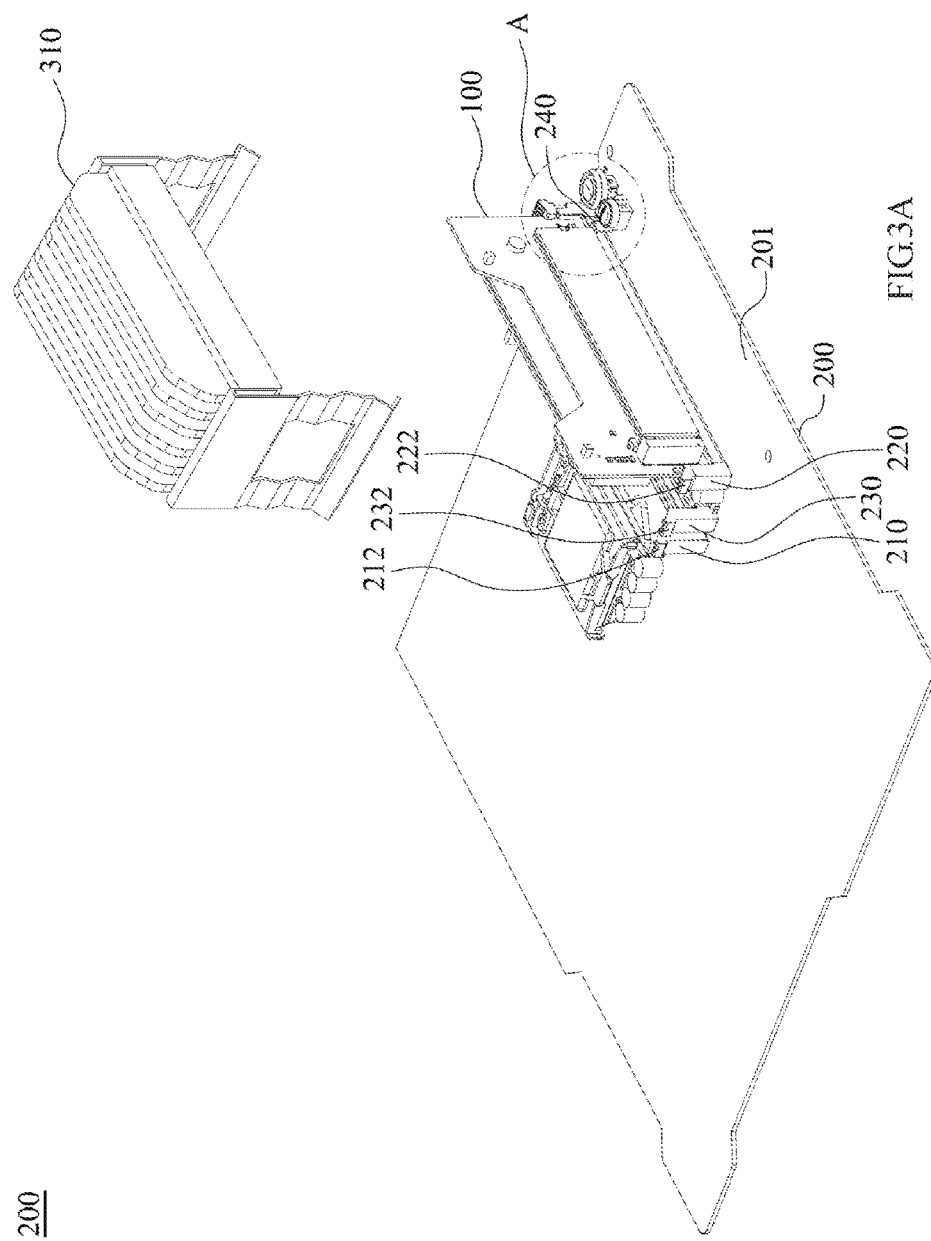

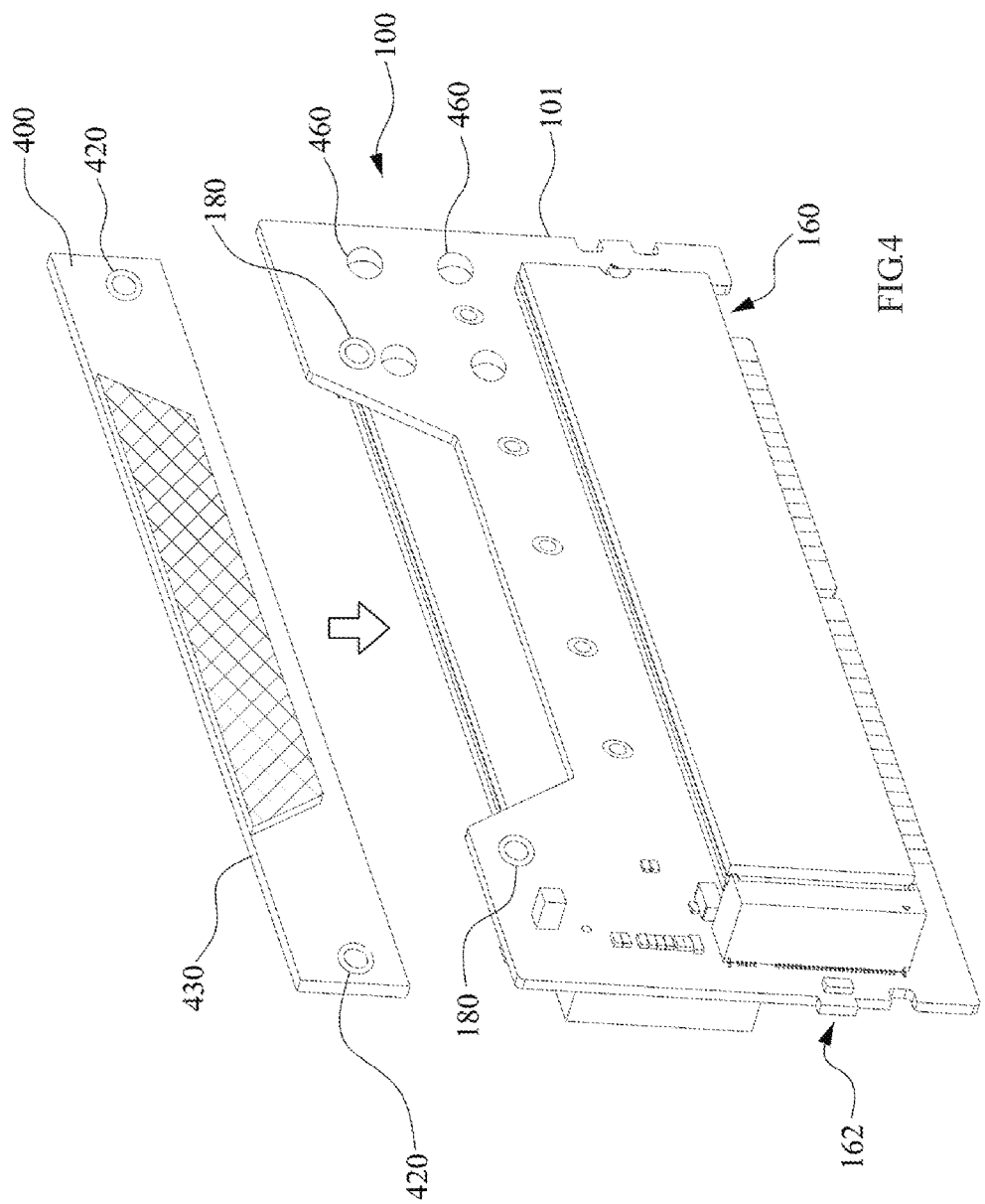

ADAPTIVE CARD AND MOTHERBOARD HAVING THE SAME

CROSS-REFERENCE TO RELATED APPLICATION

This application claims the priority benefit of CN application serial No. 201621252669.0, filed on Nov. 17, 2016. The entirety of the above-mentioned patent application is hereby incorporated by references herein and made a part of specification.

BACKGROUND OF THE INVENTION

Field of the Invention

The disclosure relates to an adaptive card and, more specifically, to an adaptive card for a motherboard.

Description of the Related Art

With the development and popularization of the information technology, electronic devices, such as computers, are necessary in human life. M.2 interface is a specification for an expansion function card and a connector of a computer, which has flexible configuration. M.2 interface is applicable for different structures, such as modules with different widths and lengths. The M.2 interface specification provides more characteristic to achieve a higher level interface. As a result, the M.2 interface is more suitable for a solid storage that used in a notebook or a tablet computer than the mSATA, specifically when used in a small-size device.

A plurality of functions can be integrated in the M.2 device, such as WIFI, Bluetooth, satellite navigation, Near Field Communication (NFC), digital broadcasting, Wireless Gigabit Alliance (WiGig), Wireless Wide Area Network (WWAN) and Solid State Disk (SSD). The M.2 interface is a new standard storage device format and its hardware structure specification is also established recently.

When the M.2 device is assembled to a motherboard, they still have to be plugged in and out, or even added more M.2 devices onto the same motherboard when required. However, it is difficult to be disassembled and replaced with a conventional configuration.

BRIEF SUMMARY OF THE INVENTION

According to a first aspect of the disclosure, an adaptive card is provided. The adaptive card is for a motherboard, the motherboard includes a connecting slot. The adaptive card comprises a main body, a first connector, a second connector, a plurality of first fixing holes, a plurality of second fixing holes and a port. The main body includes a first surface, a second surface and a side edge. The first connector is configured on the first surface. The second connector is configured on the second surface. A plurality of first fixing holes are formed on the first surface and arranged along a direction corresponding to an insertion direction of the first connector. A plurality of second fixing holes are formed on the second surface and arranged along a direction corresponding to an insertion direction of the second connector. A port is configured on the side edge and used to be connected to the connecting slot.

According to a second aspect of the disclosure, a motherboard is provided. The motherboard comprises a main body, a memory slot, a M.2 adaptive card slot, and a M.2 adaptive card. The M.2 adaptive card includes a main body, a first M.2 connector, a second M.2 connector, a plurality of first fixing holes, a plurality of second fixing holes and a port. The main body includes a first surface, a second surface and a side edge. The first M.2 connector is configured on the first surface. The second M.2 connector is configured on the second surface. The plurality of first fixing holes are formed on the first surface, and corresponding to the first M.2 connector. The plurality of second fixing holes are formed on the second surface, and corresponding to the second M.2 connector. The port is disposed on the side edge to be connected to the connecting slot.

In sum, according to the adaptive card and the motherboard with the adaptive card in embodiments of the disclosure, the M.2 device can be configured more. The M.2 devices are easily detached. The heat dissipation efficiency and the operation efficiency of the M.2 device are improved.

BRIEF DESCRIPTION OF THE DRAWINGS

These and other features, aspects and advantages of the invention will become better understood with regard to the following embodiments and accompanying drawings.

FIG. 3A is a schematic view showing a motherboard with an adaptive card in an embodiment.

FIG. 4 is a schematic view showing an adaptive card and a light guiding device in an embodiment.

DETAILED DESCRIPTION OF THE EMBODIMENTS

Figure 1:
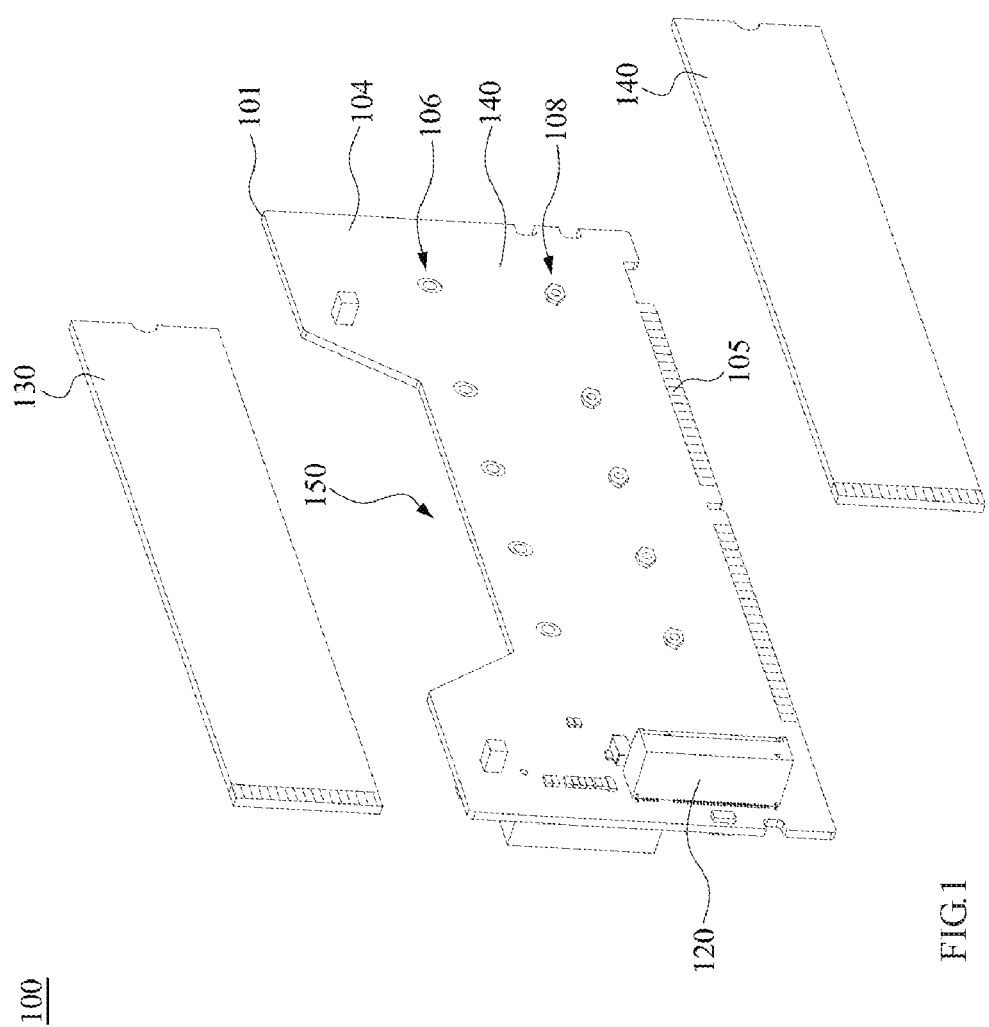
FIG. 1 is a schematic diagram showing an adaptive card in an embodiment.
Figure 2:
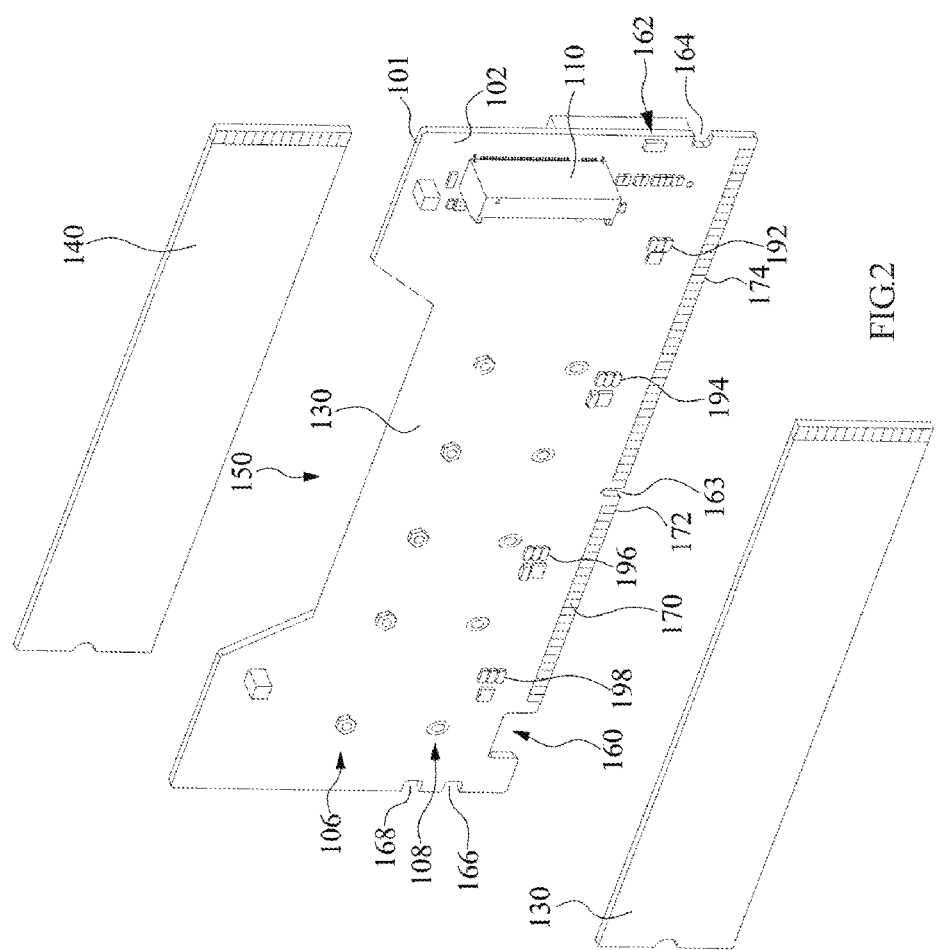
FIG. 2 is a schematic diagram showing a back of the adaptive card shown in FIG. 1.
Figure 3B:
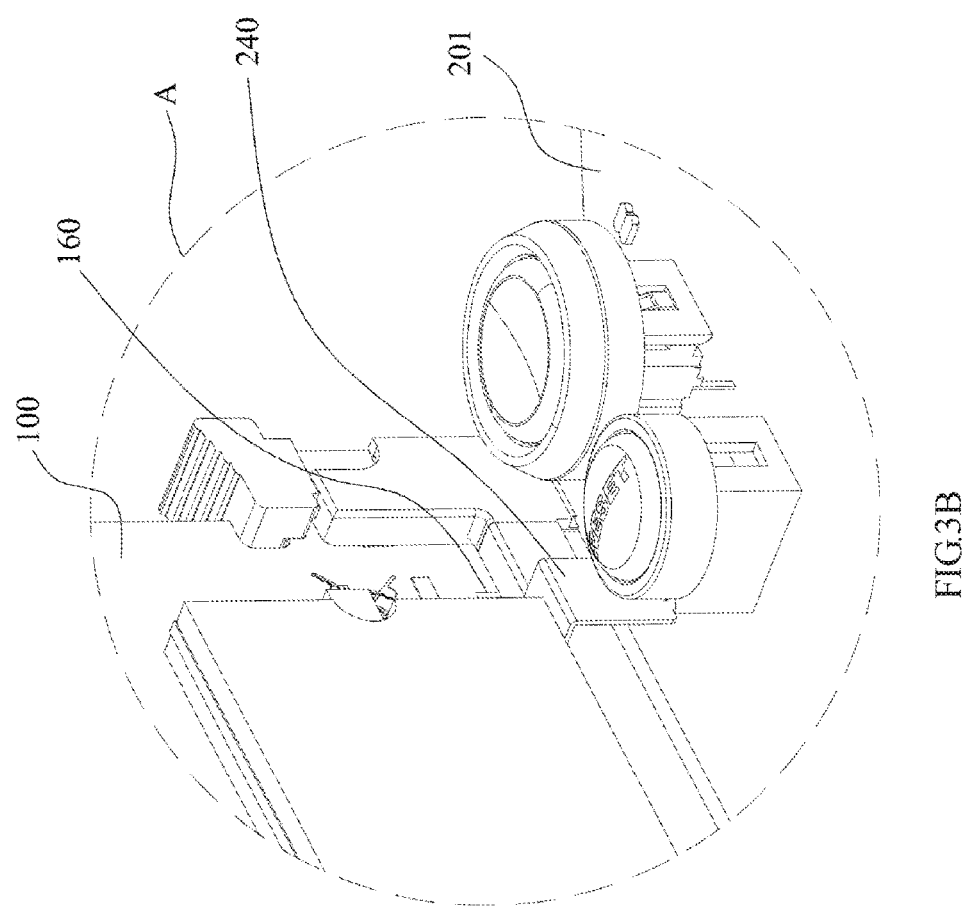
FIG. 3B is a local enlarged view of partial of a motherboard with an adaptive card in FIG. 3A.

Please refer to FIG. 1. FIG. 1 is a schematic diagram showing an adaptive card in an embodiment. FIG. 2 is a schematic diagram showing a back of the adaptive card shown in FIG. 1. As shown in FIG. 1 and FIG. 2, in an embodiment, an adaptive card, such as a M.2 adaptive card 100, includes a main body 101, such as a circuit board. The main body 101 includes a first surface 102, a second surface 104 and a side edge 105.

A first connector, such as a first M.2 connector 110, is disposed on the first surface 102. A second connector, such as a second M.2 connector 120, is disposed on the second surface 104.

A plurality of first fixing holes, such as first M.2 fixing holes 106, are formed on the first surface 102 and arranged along a direction corresponding to an insertion direction of the first M.2 connector 110.

A plurality of second fixing holes, such as second M.2 fixing holes 108, are formed on the second surface 104 and arranged along a direction corresponding to an insertion direction of the second M.2 connector 120.

A port 170 is formed on the side edge 105 of the main body 101. The port 170 is configured to be plugged into a connecting slot of a motherboard. In an embodiment, the connecting slot is an adapter slot. The exterior of the adapter slot is similar to that of a memory slot of the motherboard. In an embodiment, the port 170 is a connecting unit with golden fingers formed on the main body 101. The first M.2 fixing holes 106 and the second M.2 fixing holes 108 are through holes or blind holes, which is not limited herein.

In an embodiment, the first M.2 device 130 is connected to the first M.2 connector 110. The second M.2 device 140 is connected to the second M.2 connector 120. In an embodiment, the first M.2 device 130 and the second M.2 device 140 are M.2 hard disks.

In an embodiment, an opening 150 is formed on the main body 101. The opening 150 has a regular or irregular shape in embodiments. At least a part of the first M.2 device 130 is exposed from the opening 150. Then, when heat is dissipated from a side of the main body 101, the heat dissipation effect of the first M.2 device 130 is improved via the opening 150 of the main body 101. In an embodiment, the first M.2 device 130 is disposed above the main body 101 or under the main body 101. The opening 150 is formed above the main body 101 or under the main body 101 correspondingly, which is not limited herein.

In an embodiment, the M.2 adaptive card 100 further includes a light emitting diode (LED) module disposed on the main body 101. The LED module is controlled by a control module, such as a central processing unit (CPU), to show predetermined illumination changes.

In an embodiment, the LED module includes light emitting diodes 192,194,196 and 198. The light emitting diodes 192,194,196 and 198 are colorized light emitting diodes, respectively. The light emitting diodes 192,194,196 and 198 emits predetermined light according to a state of the M.2 adaptive card 100 or the state of a computer to remind users. For example, blue light is emitted when the M.2 adaptive card 100 is under normal operation. Red light is emitted when the temperature of the M.2 adaptive card 100 is high.

Please refer to FIG. 4. In an embodiment, the M.2 adaptive card 100 includes a light guiding device 400. The light guiding device 400 is disposed above the opening 150 of the main body 101. In an embodiment, the M.2 adaptive card 100 includes a fixing member 180. Fixing parts 420 are disposed on two ends of the light guiding device 400. The light guiding device 400 are fixed to the opening 150 of the main body 101 via bonding or screwing in embodiments.

In an embodiment, a height of a light guiding portion 430 configured in the center of the light guiding device 400 is higher than that of the fixing part 420 configured at the two ends of the light guiding device 400. Then, the light guiding device 400 is easily engaged in the opening 150 of the main body 101.

In an embodiment, after the light guiding portion 430 of the light guiding device 400 is disposed in the opening 150 of the main body 101, a gap is exited between the light guiding portion 430 of the light guiding device 400 and the opening 150 of the main body 101. Then, airflow passes through the opening 150 of the main body 101 to cool the first M.2 device 130. Moreover, a plurality of air holes 460 are formed on the main body 101 to improve the heat dissipation efficiency.

In an embodiment, the light guiding device 400 is made of a light guiding material, such as acrylic and glass. The light guiding device 400 is active luminescence or passive luminescence. In an embodiment, the light guiding device 400 is electrically connected to a light control device to transmit light. In an embodiment, the light guiding device 400 guides the light from the light emitting diodes 192,194, 196 and 198 of the LED module of the M.2 adaptive card 100. Then, light patterns are shown on the light guiding device 400.

Please refer to FIG. 1 to FIG. 3B. In an embodiment, the M.2 adaptive card 100 further includes a first fool-proof baffle 162 and a first fool-proof notch 160. Then, the M.2 adaptive card 100 would not be plugged into another connecting slot of the motherboard 200, such as a memory slot 210 or a memory slot 230 by mistake.

The M.2 adaptive card 100 includes tenon fixing openings 164, 166, 168 and the first fool-proof baffle 162. The positions of the tenon fixing opening 164, the tenon fixing openings 164, 166, 168 and the first fool-proof baffle 162 correspond to that of a standard memory slot tenon 212 and a memory slot tenon 213.

The number of clips of an adaptive card slot tenon 222 of an adaptive card slot 220 is one less than that of the memory slot tenon 212 and the memory slot tenon 213. As a result, when the M.2 adaptive card 100 is plugged into the standard memory slot 210 or the memory slot 230 by mistake, the memory slot tenon 212 or the memory slot tenon 213 located at sides of the memory slot 210 or the memory slot 230 are interfered with the first fool-proof baffle 162. Then, the M.2 adaptive card 100 would not be engaged into the memory slot 210 or the memory slot 230. As a result, it avoids that the M.2 adaptive card 100 is plugged into the standard memory slot 210 or the memory slot 230 by mistake. Please refer to FIG. 4, the first fool-proof baffle 162 is protruded from the main body 101 to further avoid that the M.2 adaptive card 100 is mistakenly inserted in the standard memory slot 210 or the memory slot 230.

In an embodiment, the adaptive card slot 220 formed on the main body 201 is parallel to the memory slot 210 and the memory slot 230. The adaptive card slot 220 further includes a second fool-proof baffle 240. When the second fool-proof baffle 240 is matched with the first fool-proof notch 160 of the main body 101, the M.2 adaptive card 100 is inserted into adaptive card slot 220 correctly. When a memory card, such as a Double Data Rate Synchronous Dynamic Random Access Memory (DDR SDRAM), is mistakenly inserted towards the adaptive card slot 220, the second fool-proof baffle 240 avoids the further plug of the memory.

In an embodiment, the main body 101 further includes a fool-proof notch 163. As a result, it avoids that the M.2 adaptive card 100 is mistakenly inserted reversely into the adaptive card slot 220.

In an embodiment, the port 170 includes a plurality of first part terminals 172 and a plurality of second part terminals 174. The first M.2 connector 110 is electronically connected to the first part terminal 172. The second M.2 connector 120 is electronically connected to the second part terminal 174. The first part terminal 172 and the second part terminal 174 are not electrically connected with each other.

In an embodiment, the adaptive card slot 220 for the M.2 adaptive card 100 is similar to the memory slot 210 and the memory slot 230. The adaptive card slot 220, the memory slot 210 and the memory slot 230 are arranged on the main body 201 in parallel. In order to reduce an operation temperature of the M.2 adaptive card 100 effectively, a memory heat-dissipation module 310 is disposed on the motherboard 200.

In an embodiment, the memory heat-dissipation module 310 is a heat-dissipation fin group or a heat-dissipation fan. In an embodiment, the memory heat-dissipation module 310 is fixed above the memory slot 210, the memory slot 230 and the adaptive card slot 220. The memory heat-dissipation module 310 cools the memory and the M.2 adaptive card 100 simultaneously from above. Then, the operation temperature of the M.2 adaptive card 100 is reduced. The memory slot 210, the memory slot 230, the adaptive card slot 220 are DDR, DDR2, DDR3 slot or an improvement of DDR, DDR2, DDR3 slot, which is not limited herein. In an embodiment, the adaptive card slot 220 is an improvement of a computer slot to be matched with the M.2 adaptive card 100, such as a Peripheral Component Interconnect (PCI) and a Peripheral Component Interconnect Express (PCI-E).

Figure 5:
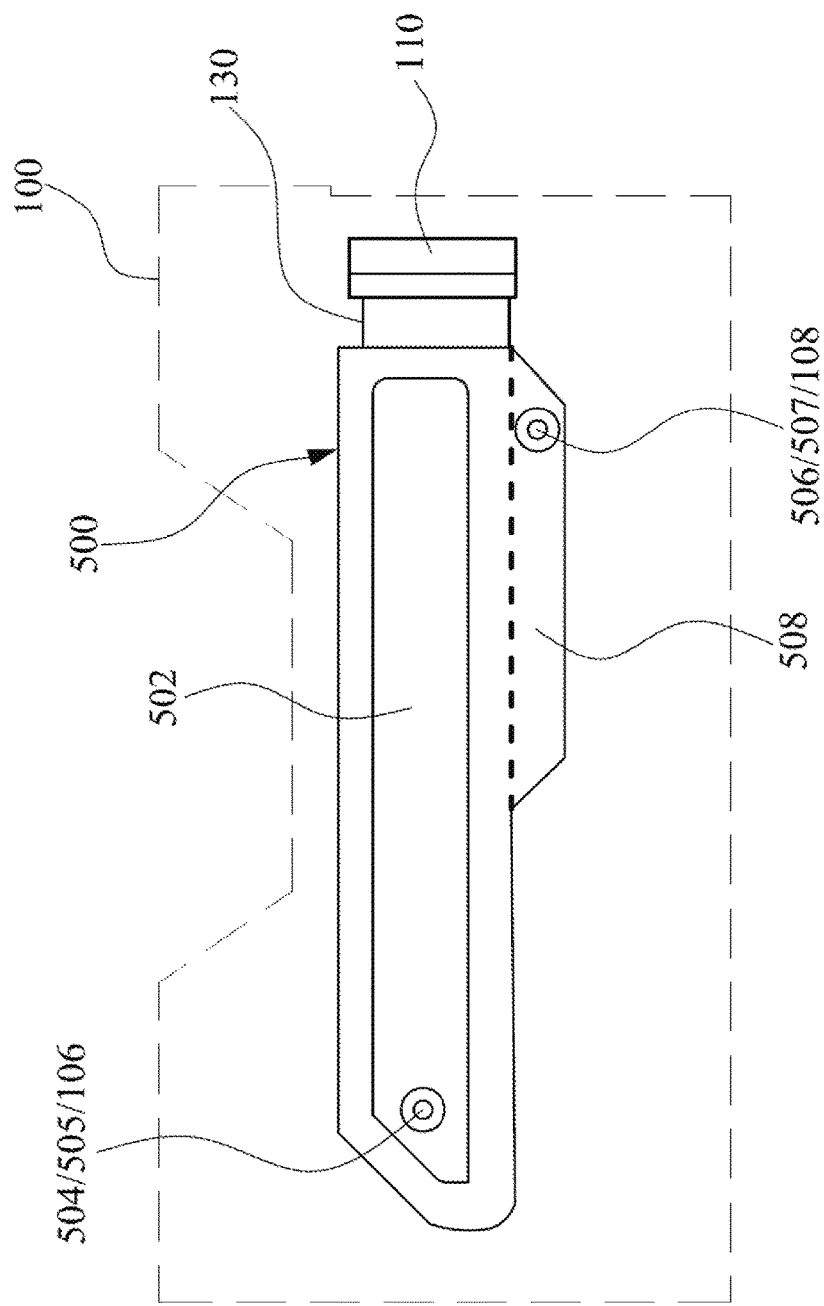
FIG. 5 is a schematic view showing an adaptive card and an assisting device in an embodiment.

FIG. 5 is a schematic view showing an adaptive card and an assisting device in an embodiment. In the embodiment, the M.2 adaptive card 100 further includes an assisting device 500. In an embodiment, the assisting device 500 is a heat sink for the M.2 device, such as an air-cooled heat sink and a water-cooled heat sink. In an embodiment, the assisting device 500 is a cable fixer, a nameplate, a line regulator or a support for a fan, which is not limited herein. The assisting device 500 is fixed to a standard first M.2 fixing hole 106 and an extending hole of the circuit board via a bolt conformed to the M.2 specification.

In an embodiment, the assisting device 500 is a heat dissipation device. The assisting device 500 includes a main portion 502. The main portion 502 is extended toward a connecting hole of the first M.2 connector 110. A first fixing through hole 505 is formed on the main portion 502.

Please refer to FIG. 1, in an embodiment, the assisting device 500 is fixed to the main body 101 when a first fixing bolt 504 passes through one of the first M.2 fixing holes 106 and the first fixing through hole 505. The first fixing through hole 505 is configured corresponding to one or more fixing holes of the first M.2 fixing hole 106 on the main body 101. Various assisting devices 500 are fixed to the main body 101 via the first fixing bolt 504 fixed to a corresponding first M.2 fixing hole 106.

In an embodiment, the first the first M.2 device 130 is also fixed to the first M.2 fixing hole 106 of the main body 101 via the first fixing bolt 504.

In an embodiment, the first M.2 fixing hole 106 and the second M.2 fixing hole 108 are through holes formed on the main body 101. The assisting device 500 further includes a first extending part 508. The first extending part 508 is extended outwardly from the main portion 502. A second fixing through hole 507 is formed on the first extending part 508. The second fixing through hole 507 is configured corresponding to the second M.2 fixing hole 108. The second fixing bolt 506 passes through the second fixing through hole 507 to the first surface 102 of the main body 101 from. Then, the assisting device 500 is fixed to one of the second M.2 fixing holes 108 of the main body 101. As a result, the assisting device 500 is fixed on the main body 101 more stably. In an embodiment, the assisting device 500 is a heat dissipation device. The main portion 502 is the main portion of the heat dissipation device. The first extending part 508 is an extending part of the first heat dissipation device. The heat dissipation device is fixed at the first M.2 fixing hole 106 and the second M.2 fixing hole 108 of the main body 101 steadily.

According to the adaptive card and the motherboard with the adaptive card in embodiments of the disclosure, the M.2 device can be configured more. The M.2 devices are easily detached. The heat dissipation efficiency and the operation efficiency of the M.2 device are improved.

Although the invention has been disclosed with reference to certain embodiments thereof, the disclosure is not for limiting the scope. Persons with ordinary skill in the art may make various modifications and changes without departing from the scope of the invention. Therefore, the scope of the appended claims should not be limited to the description of the embodiments described above.

What is claimed is:

1. An adaptive card, adapted to a motherboard with a connecting slot, the adaptive card comprising:
 a main body, including a first surface, a second surface, a side edge and an opening;
 a first connector, configured on the first surface, and the first connector is a M.2 connector for connecting to a first M.2 device;
 a second connector, configured on the second surface;
 a plurality of first fixing holes, formed on the first surface and arranged along a direction corresponding to an insertion direction of the first connector for fixing the first M.2 device;
 a plurality of second fixing holes, formed on the second surface and arranged along a direction corresponding to an insertion direction of the second connector; and
 a port, configured on the side edge and configured to be connected to the connecting slot, wherein at least a part of the first M.2 device is exposed through the opening, and the opening is configured to cool the first M.2 device by allowing airflow to pass therethrough.

2. The adaptive card according to claim 1, wherein the second connector is a M.2 connector, the first fixing holes and the second fixing holes are M.2 fixing holes for respectively connecting and fixing to the first M.2 device and a second M.2 device.

3. The adaptive card according to claim 1, wherein the main body further includes a light emitting diode (LED) module.

4. The adaptive card according to claim 1, wherein the main body further includes a fool-proof baffle and a first fool-proof notch.

5. A motherboard, comprising:
 a main body;
 a memory slot;
 a M.2 adaptive card slot; and
 a M.2 adaptive card, the M.2 adaptive card includes:
 a main body, including a first surface, a second surface and a side edge;
 a first M.2 connector, configured on the first surface, for connecting to a first M.2 device;
 a second M.2 connector, configured on the second surface;
 a plurality of first fixing holes, formed on the first surface, the first fixing holes are corresponding to the first M.2 connector;
 a plurality of second fixing holes, formed on the second surface, the second fixing holes are corresponding to the second M.2 connector; and
 a port, configured on the side edge and configured to be connected to the connecting slot, wherein the main body of the M.2 adaptive card includes an opening to expose at least a part of the first M.2 device, and the opening is configured to cool the first M.2 device by allowing airflow to pass therethrough.

6. The motherboard according to claim 5, wherein the M.2 adaptive card further includes a LED module.

7. The motherboard according to claim 5, wherein the main body of the M.2 adaptive card further includes a fool-proof baffle and a first fool-proof notch, and the M.2 adaptive card slot includes a second fool-proof baffle.

8. The motherboard according to claim 5, wherein the motherboard further includes a heat dissipation module.

* * * * *